US011310949B2

United States Patent
Awano

(10) Patent No.: US 11,310,949 B2
(45) Date of Patent: Apr. 19, 2022

(54) COMPONENT MOUNTING DEVICE

(71) Applicant: YAMAHA HATSUDOKI KABUSHIKI KAISHA, Iwata (JP)

(72) Inventor: Yukinari Awano, Iwata (JP)

(73) Assignee: YAMAHA HATSUDOKI KABUSHIKI KAISHA, Iwata (JP)

(*) Notice: Subject to any disclaimer, the term of this patent is extended or adjusted under 35 U.S.C. 154(b) by 49 days.

(21) Appl. No.: 16/768,591

(22) PCT Filed: Dec. 11, 2017

(86) PCT No.: PCT/JP2017/044285
§ 371 (c)(1),
(2) Date: May 29, 2020

(87) PCT Pub. No.: WO2019/116416
PCT Pub. Date: Jun. 20, 2019

(65) Prior Publication Data
US 2020/0344927 A1   Oct. 29, 2020

(51) Int. Cl.
*H05K 13/04* (2006.01)
*H05K 13/02* (2006.01)

(52) U.S. Cl.
CPC ....... *H05K 13/0419* (2018.08); *H05K 13/021* (2013.01); *H05K 13/0215* (2018.08)

(58) Field of Classification Search
CPC ............. H05K 13/021; H05K 13/0215; H05K 13/0419
See application file for complete search history.

(56) References Cited

U.S. PATENT DOCUMENTS

| 2017/0042073 A1* | 2/2017 | Nagasawa .......... H05K 13/0417 |
| 2018/0148289 A1* | 5/2018 | Oyama ............. H05K 13/0215 |

FOREIGN PATENT DOCUMENTS

| CN | 106455467 A | 2/2017 |
| JP | S62-213299 A | 9/1987 |
| JP | 2000-013095 A | 1/2000 |
| JP | 2000-151186 A | 5/2000 |
| JP | 2014-112579 A | 6/2014 |
| JP | 2015-012180 A | 1/2015 |
| JP | 2015-065381 A | 4/2015 |

(Continued)

OTHER PUBLICATIONS

An Office Action; "Notice of Reasons for Refusal," mailed by the Japanese Patent Office dated Jan. 19, 2021, which corresponds to Japanese Patent Application No. 2019-559423 and is related to U.S. Appl. No. 16/768,591; with English language translation.

(Continued)

*Primary Examiner* — Carl J Arbes
(74) *Attorney, Agent, or Firm* — Studebaker & Brackett PC

(57) ABSTRACT

A component mounting device described herein includes a tape driving section (a driving shaft motor, a front-side sprocket, a timing belt) feeding forward component tapes including components, a tape guide section guiding downward an empty tape that has no component as a result of suctioning with a suction nozzle, a tape cutting section disposed below the tape guide section and cutting the empty tape according to determination that the component tape has no component, and a tape discharge section disposed below the tape cutting section and discharging downward a cut part of the empty tape.

6 Claims, 14 Drawing Sheets

(56) References Cited

FOREIGN PATENT DOCUMENTS

| | | | |
|---|---|---|---|
| JP | 2016-127218 A | | 7/2016 |
| WO | 2014097473 | * | 6/2014 |
| WO | 2016/194142 A1 | | 12/2016 |
| WO | 2016194142 A1 | * | 11/2017 |

OTHER PUBLICATIONS

International Search Report issued in PCT/JP2017/044285; dated Jan. 30, 2018.
An Office Action mailed by China National Intellectual Property Administration dated Oct. 29, 2020, which corresponds to Chinese Patent Application No. 201780097374.1 and is related to U.S. Appl. No. 16/768,591 with English language translation.

* cited by examiner

COMPONENT MOUNTING DEVICE

CROSS-REFERENCE TO RELATED APPLICATION

This application is a National Stage of International Patent Application No. PCT/JP2017/044285, filed Dec. 11, 2017, the entire content of which is incorporated herein by reference.

BACKGROUND

Technical Field

The technology described herein relates to a component mounting device.

Background Art

There has been known an electronic component mounting device described in Japanese Unexamined Patent Publication No. 2015-12180 as a component mounting device that can surely feed an empty tape into a tape cutter from a guide section such that the empty tape can be cut appropriately. The electronic component mounting device includes the guide section, the tape cutter, and an air blowing section. The guide section guides downward the empty tape that is fed from the downstream end of the tape feeder in the tape feed direction. The empty tape is cut with the cutter below the guide section and the cutter includes a fixed blade and a movable blade that is movable in the horizontal direction. The air blowing section is disposed near a cutting position where the empty tape is cut with the tape cutter. The air blowing section blows air to the lower end portion of the empty tape from an upper side to a lower side at predefined timing. Accordingly, the cutting operation can be started while the lower end portion of the empty tape being almost vertical to a moving surface of the cutting blade. Therefore, jamming or tangling of the tape is less likely to be caused and the empty tape can be cut appropriately.

SUMMARY

However, the above electronic component mounting device is configured to cut the empty tape that is discharged downward from the guide section but is not configured to discharge the cut remaining empty tape. The remaining empty tape may be discharged by a sprocket of the tape feeder; however, the remaining empty tape cannot be discharged after the trailing end of the empty tape passes the sprocket and remains within the guide section. If the jamming or the tangling of the empty tape is caused due to the remaining empty tape, the empty tape cannot be discharged.

A component mounting device described herein includes a tape driving section configured to feed forward component tapes that include components, a tape guide section configured to guide downward an empty tape that has no component as a result of suctioning with a suction nozzle, a tape cutting section disposed below the tape guide section and configured to cut the empty tape according to determination that a component tape has no component, and a tape discharge section disposed below the tape cutting section and configured to discharge downward a cut part of the empty tape.

According to such a configuration, the empty tape is fed to the tape guide section by the tape driving section and the empty tape is guided downward by the tape guide section. If it is determined that the component tape has no component, the empty tape that projects downward from the tape guide section is cut by the tape cutting section and a cut piece of the tape is discharged by the tape discharge section. Thus, the empty tape that remains in the tape guide section is less likely to be jammed or tangled.

The component mounting device described herein may be configured as follows.

The component mounting device may further include a first sensor detecting presence of a tape included in the component tape, and a controller configured to control the tape discharge section to discharge the empty tape downward if the first sensor does not detect the tape. According to such a configuration, since the first sensor can detect that there is no tape, the empty tape can be discharged based on the detection result.

The component mounting device may further include a second sensor disposed on a back side with respect to the first sensor and detecting a trailing end of the tape. If one of the tapes is not detected by the second sensor, the controller may control the tape cutting section to cut the empty tapes collectively and control the tape driving section to feed forward only the empty tape to be discharged and thereafter control the tape discharge section to discharge the empty tape to be discharged.

According to such a configuration, if the multiple empty tapes are present, it is difficult to discharge only a specific empty tape. However, only the empty tape that is to be discharged is fed forward by the tape driving section such that only the empty tape to be discharged can be discharged by the tape discharge section.

The controller may control the tape driving section to feed forward the tape and if the tape is not detected by the first sensor, the controller may stop the tape driving section and thereafter control the tape discharge section to discharge the empty tape. According to such a configuration, the empty tape can be discharged based on the detection signal on the tape output from the first sensor.

According to the technology described herein, jamming or tangling of an empty tape is less likely to be caused in a tape guide section.

DETAILED DESCRIPTION

Embodiment

One embodiment will be described with reference to FIGS. 1 to 14.

In the embodiment section, a component mounting device 10 that mounts components E on a board P and produces mounting boards will be described as one example. The components E are electronic components such as chip components and package components.

Figure 1:
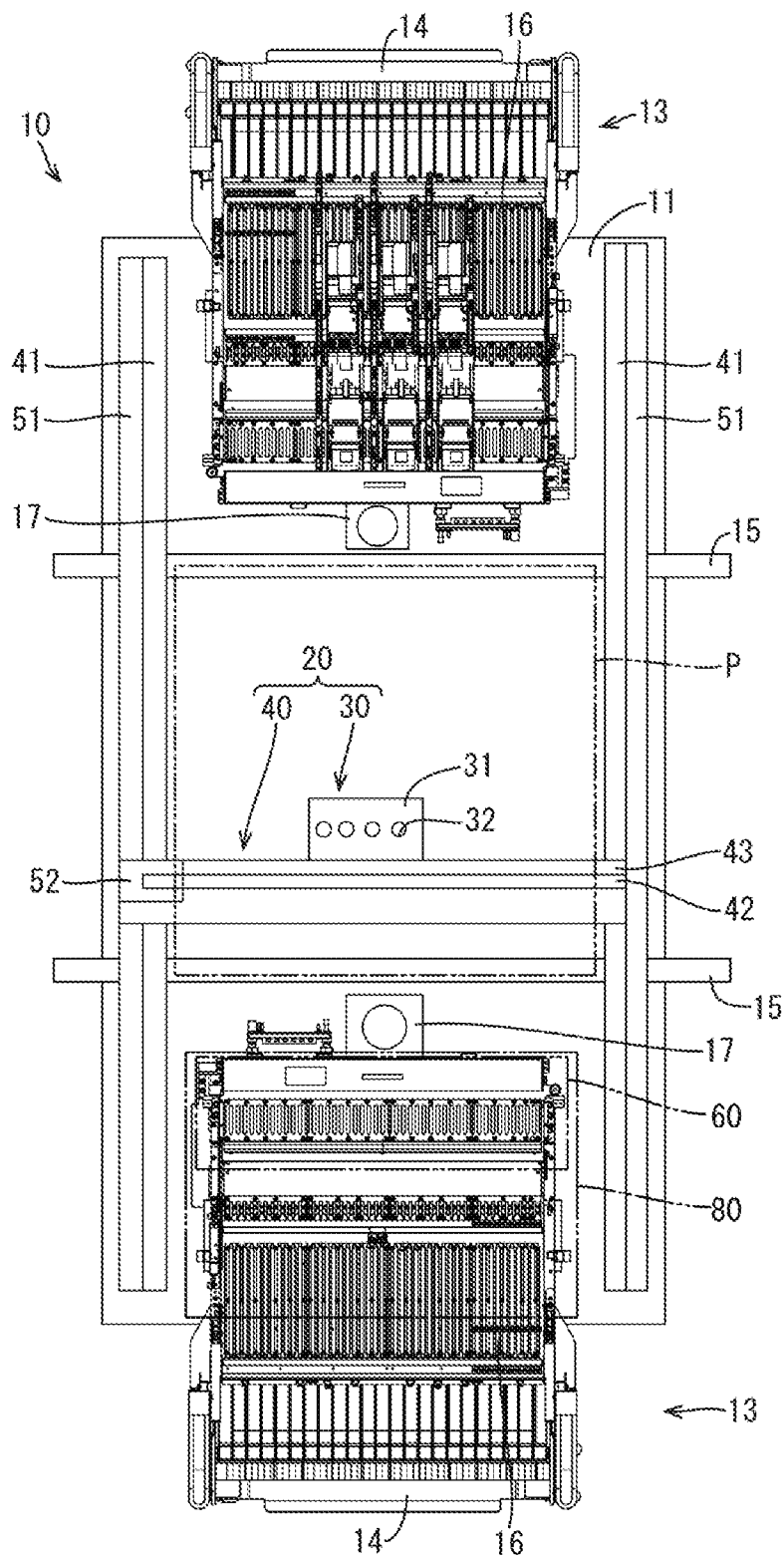
FIG. 1 is a plan view of a component mounting device.

As illustrated in FIG. 1, the component mounting device 10 includes a base mount 11, a pair of transfer conveyers 15, a component mounting unit 20, and component supply devices 13. The pair of transfer conveyers 15 are disposed on the base mount 11. The component mounting unit 20 is for mounting the components E on the board P. The component supply devices 13 supply components E to each of the component mounting units 20. In the following description, the right-left direction and the front-back direction in FIG. 1 correspond to an X-axis direction and a Y-axis direction, respectively, and the vertical direction corresponds to a Z-axis direction in FIG. 2. In the following description, the right-left direction is referred to with respect to the right-left direction in FIG. 1, the front-back direction is referred to with respect to the vertical direction in FIG. 1, and the front side in the drawing corresponds to a front side. An upper-lower direction is referred to with respect to the vertical direction in FIG. 2.

As illustrated in FIG. 1, the base mount 11 has a substantially rectangular plan view shape that is elongated in the front-back direction. The pair of transfer conveyers 15 for transferring the boards P are disposed on the base mount 11 and arranged in the front-back direction. A back-up device, which is not illustrated, is disposed below the board P to back up the board P when mounting the components E on the board P.

As illustrated in FIG. 1, the pair of transfer conveyers 15 is disposed almost in a middle section of the base mount 11 with respect to the front-back direction and transfers the board P from an upstream side to a downstream side, that is, from the right side to the left side. The board P is set on the pair of transfer conveyers 15 such that two side edges thereof are supported.

The board P supported by the pair of transfer conveyers 15 is introduced from the right side (the upstream side) of the base mount 11 to the middle section of the base mount 11 with respect to the right-left direction by the transfer conveyers 15. After the components E are mounted on the board P, the board is discharged to the left side (the downstream side) of the base mount 11 by the transfer conveyers 15.

Figure 2:
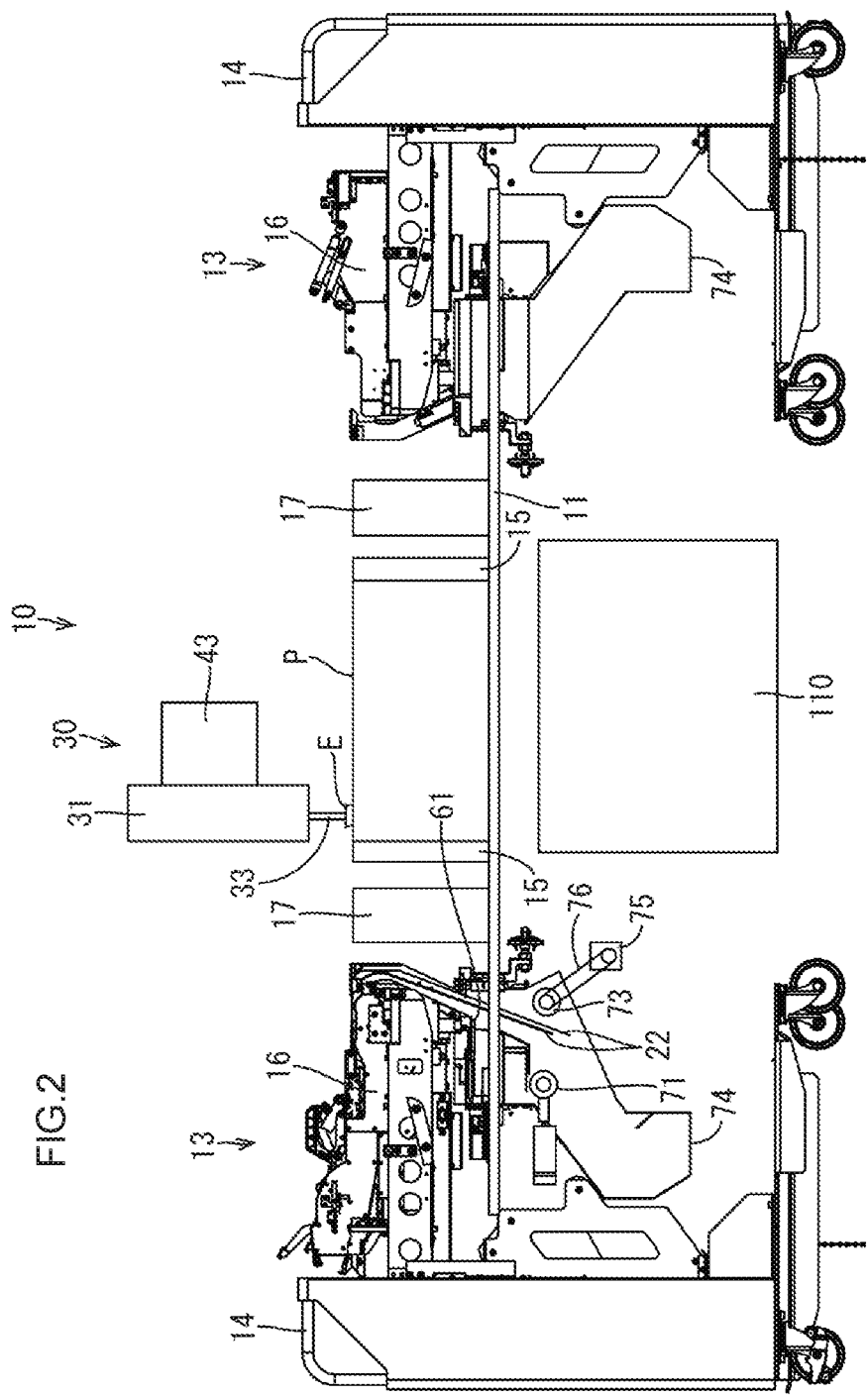
FIG. 2 is a side view of the component mounting device.

As illustrated in FIGS. 1 and 2, a pair of component supply devices 13 are arranged on the respective two edge portions of the base mount 11 with respect to the front-back direction. Each of the component supply devices 13 is supported by a cart 14. Each of the component supply devices 13 is a feeder type and feeders 16 are installed in each of the component supply devices 13 so as to be arranged in the right-left direction. Each of the feeders 16 includes a front-side sprocket 163 that pulls a component tape 21 storing the components E from a reel. The components E are supplied one by one at the front end section of the feeder 16.

As illustrated in FIGS. 1 and 2, the component mounting unit 20 includes a head driving device 40 and a head unit 30 included in the head driving device 40.

The head driving device 40 is configured to move each head unit 30 in the front-back direction and the right-left direction above the base mount 11. As illustrated in FIGS. 1 and 2, the head driving device 40 includes a pair of Y-direction frames 41 and an X-direction frame 43. The Y-direction frames 41 are disposed near the respective right and left edges of the base mount 11. The X-direction frame 43 is supported by the Y-direction frames 41. The head unit 30 is attached to the X-direction frame 43. The pair of Y-direction frames 41 are elongated in the front-back direction.

A Y-direction main shaft 42 and a Y-axis linear motor 51 are attached to the Y-direction frame 41. The X-direction frame 43 is attached to the Y-direction main shaft 42 so as to be movable in the front-back direction. The Y-axis linear motor 51 is disposed to extend from the Y-direction frame 41 to the X-direction frame 32. The Y-direction main shaft 42 includes a slider and a Y-direction guide rail on which the slider is attached so as to be movable in the front-back direction. According to the control of a current flow to the Y-axis linear motor 51, the X-direction frame 43 fixed to the slider moves on the Y-direction guide rail in the front-back direction.

A front-back moving area in which the X-direction frame 43 is allowed to move in the front-back direction corresponds to an area within the base mount 11 ranging from the component supply device 13 on the front side to the component supply device 13 on the back side. This allows the head unit 30 that is attached to the X-direction frame 43 to move above the board P that is arranged on the middle section of the base mount 11 with respect to the front-back direction.

On the other hand, the X-direction frame 43 extends in the right-left direction from one Y-direction frame 41 to another Y-direction frame 41 and is mounted in a both-ends supported state. An X-direction guide rail 44, an X-direction main shaft 45, and an X-axis servo motor 52 are attached to the X-direction frame 43. The X-direction guide rail 44 extends along the X-direction frame 43. The X-direction main shaft 45 includes a ball nut (not illustrated) and a ball screw that is screwed into the ball nut. The X-axis servo motor 52 is attached to the end portion of the X-direction main shaft 45.

The head unit 30 is attached to the X-direction guide rail 44 so as to be movable in the right-left direction. According to the forward movement and the backward movement of the ball nut along the ball screw, the head unit 30 that is fixed to the ball nut is moved along the X-direction guide rail 44 in the right-left direction.

The head unit 30 is allowed to move from one end of the X-direction frame 43 close to the Y-direction main shaft 42 to another end of the other X-direction frame 43 close to the Y-direction main shaft 42. Namely, the head nut 30 can move freely in the X-direction and the Y-direction on the board P.

The head unit 30 is for picking up the component E that is supplied by the component supply device 13 and mounting it on the board P. As illustrated in FIG. 2, the head unit 30 includes a box-shaped head unit body 31 and mount heads 32 projecting downward from the head unit body 31.

Although details are not illustrated, four mount heads 32 are arranged in the right-left direction and project downward from the lower end portion of the head unit body 31. Each of the mount heads 32 includes a nozzle shaft extending in the upper-lower direction and a suction nozzle 33 that has an almost cylindrical shape and is detachably attached to the lower end of the nozzle shaft.

The nozzle shaft is allowed to fit in the suction nozzle 33 from the above. When the nozzle shaft is fitted in the suction nozzle 33, an elastic holding piece (not illustrated) of the nozzle shaft and a holding projection (not illustrated) of the suction nozzle 33 are joined together such that the suction nozzle 33 is held by the nozzle shaft.

The suction nozzles 33 that are held by the respective nozzle shafts are supplied with positive pressure and negative pressure through the nozzle shafts by the air supply device. If the suction nozzle 33 is supplied with negative pressure, the suction nozzle 33 can suction and hold a component E at the lower end thereof. If the suction nozzle 33 is supplied with positive pressure, the suction nozzle 33 releases the component E.

Each mount head 32 can be moved up and down in the upper-lower direction by the driving of a Z-axis servo motor 53 that is provided for each nozzle shaft in the head unit body 31. Each mount head 32 can revolve on a shaft by an R-axis servo motor 54 that is included in the head unit 30. This allows the head unit 30 to suction and hold the component E, which is supplied by the component supply device 13, with the suction nozzle 33 and appropriately arrange the component E at a mount position on the board P.

The head unit 30 includes a board recognizing camera 46 which is not illustrated in FIGS. 1 and 2. The board recognizing camera 46 can take images of desired portions of the base mount 11 such as a pair of fiducial marks on the board P by moving the head unit 30. Component recognizing cameras 17 are disposed on the base mount 11 and near the component supply devices 13. Each of the component recognizing cameras 17 can take an image of the component E that is held by the suction nozzle 33 in the component supply device 13.

Figure 3:
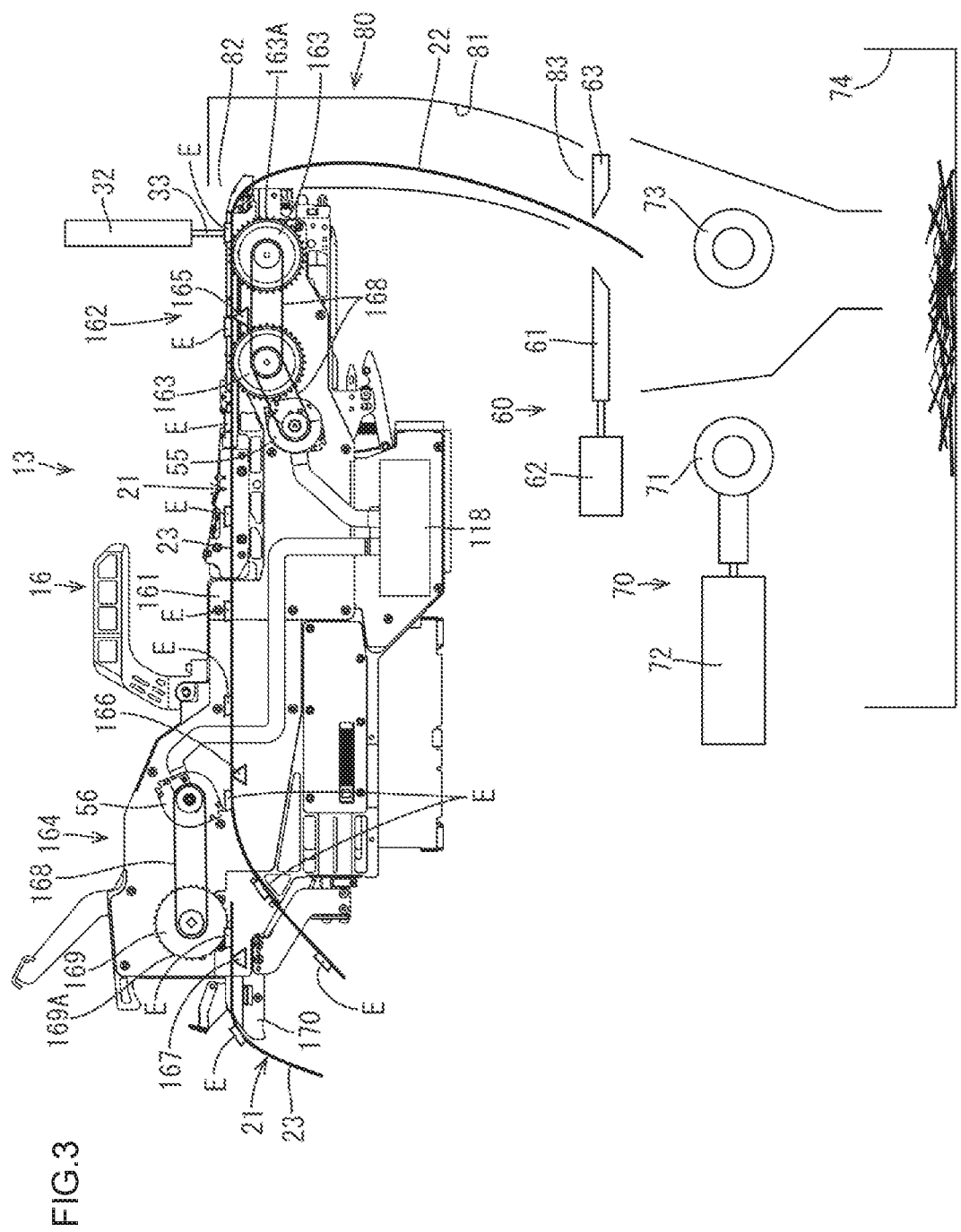
FIG. 3 is a side view of a component supply device before cutting an empty tape with a tape cutting section.

The feeder 16 in this embodiment is an auto-loading feeder (may be referred to as ALF hereinafter) that performs loading automatically. As illustrated in FIG. 3, the feeder 16 includes a body section 161, a front-side feeding section 162, a back-side feeding section 164, a first sensor 165, a second sensor 166, a third sensor 167, an ALF controller 118, a clamp member 170. The body section 161 has a long shape extending in the front-back direction (the right-left direction in FIG. 3). The front-side feeding section 162 is disposed in a front side portion of the body section 161 and the back-side feeding section 164 is disposed in a back side portion of the body section 161. The first sensor 165 is disposed within the body section 161. The second sensor 166 is disposed on the back side with respect to the first sensor 165 and the third sensor 167 is disposed on the back side with respect to the second sensor 166. The clamp member 170 is detachably disposed in the back-side end portion of the body section 161. The body section 161 is made with aluminum die casting, for example.

A component tape 21 that holds components E on a tape 23 at predefined intervals is installed in the feeder 16. The component tape 21 that is pulled from the reel is fed frontward by a driving shaft motor 55 and the components E held on the tape 23 are supplied sequentially. The tape 23 becomes an empty tape 22 when the tape 23 has no component E thereon as a result of suctioning of the components E by the suction nozzles 33. A preset component tape 21 for replacement is loaded by a loading shaft motor 56 if it is determined that the component tape 21 that is supplying components has no component. It is determined whether the component tape 21 has no component based on a detection signal output from the second sensor 166 as will be described later. The operations of the driving shaft motor 55 and a loading shaft motor 56 are controlled based on signals output from the ALF controller 118.

The front-side feeding section 162 of the feeder 16 includes the driving shaft motor 55, a pair of front-side sprockets 163, and a pair of timing belts 168. The timing belts 168 connect and rotate the driving shaft motor 55 and the pair of front-side sprockets 163. The timing belt 168 transmits power from the driving shaft motor 55 to the front-side sprockets 163 and rotates the front-side sprockets 163. The front-side sprocket 163 has teeth 163A on the outer periphery thereof at equal intervals. The teeth 163A are fit in fit holes of the component tape 21. The front-side feeding section 162 rotates the front-side sprockets 163 while the teeth 163A of the front-side sprockets 163 being meshed with the fit holes of the component tape 21 to feed the component tape 21 frontward.

The back-side feeding section 164 of the feeder 16 includes a loading shaft motor 56, a back-side sprocket 169, and a timing belt 168. The back-side sprocket 169 is disposed in an upper back-side end portion of the body section 161. The timing belt 168 connects and rotates the loading shaft motor 56 and the back-side sprocket 169. The timing belt 168 transmits power from the loading shaft motor 56 to the back-side sprocket 169 and rotates the back-side sprocket 169. The back-side sprocket 169 has teeth 169A on the outer periphery thereof at equal intervals. The teeth 169A are fit in the fit holes of the component tape 21.

In each feeder 16, the component tape 21 that is pulled from the reel enters a tape path, which is not illustrated, through the back-side end portion of the body section 161 and exits the tape path through the front portion of the body section 161 and is exposed from the upper surface of the body section 161. In the ALF, the subsequent component tape 21 can be set in the back-side sprocket 169 while a product is being produced with the proceeding component tape 21. It is detected whether the subsequent component tape 21 is set or not by the third sensor 167.

When the trailing end of the proceeding component tape 21 passes the second sensor 166 and the second sensor 166 detects no tape 22 of the component tape 21, the ALF controller 118 receives the detection signal and drives the loading shaft motor 56 to rotate the back-side sprocket 169. Thus, the component tape is shifted from the proceeding component tape 21 to the subsequent component tape 21 without detaching the feeder 16. Namely, the loading of the subsequent component tape 21 can be performed automatically.

Figure 14:
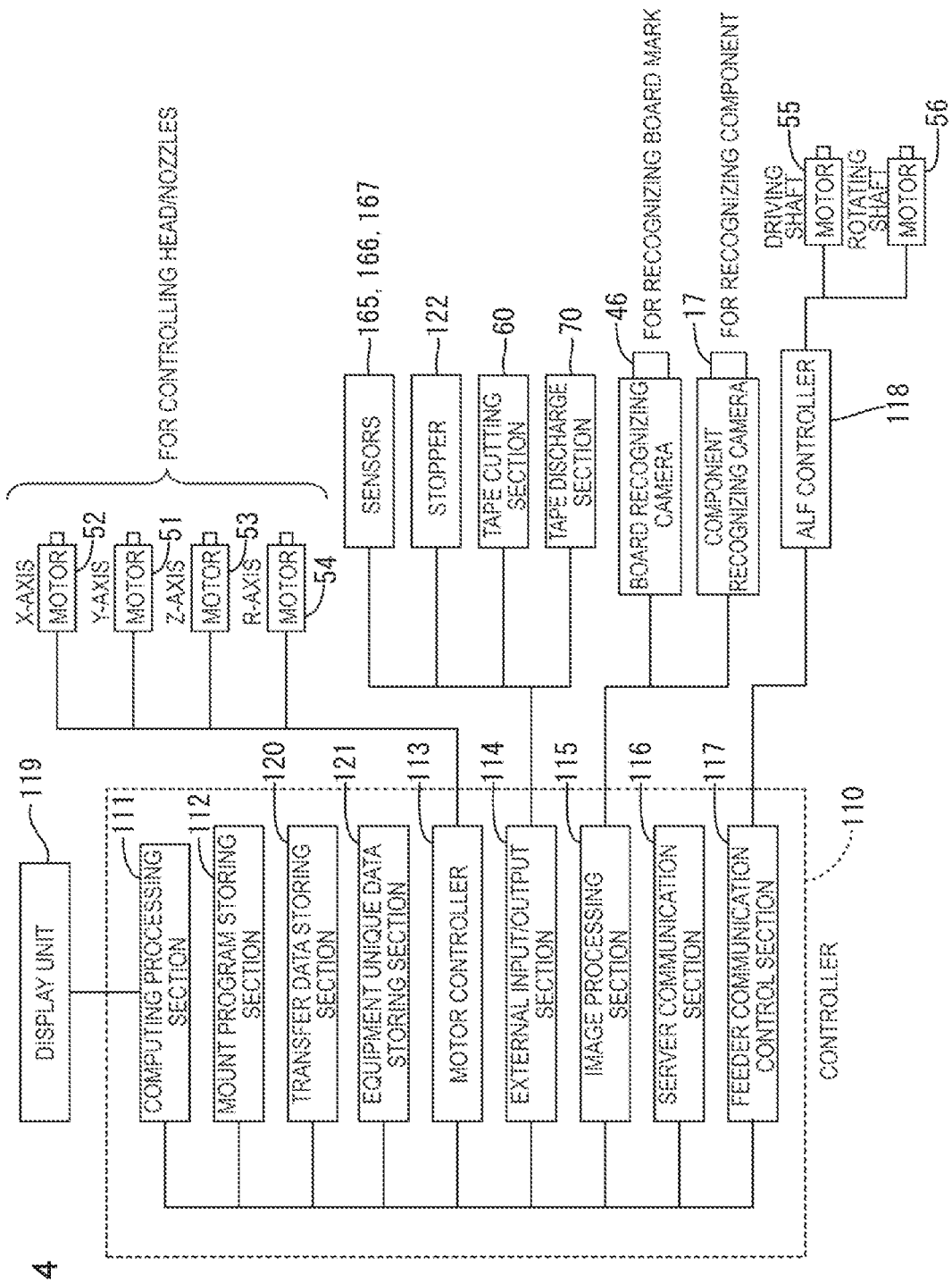
FIG. 14 is a block diagram illustrating an electric configuration of the component mounting device.

Next, an electric configuration of the component mounting device 10 will be described with reference to FIG. 14. The whole component mounting device 10 is controlled by a controller 110. The controller 110 includes a computing processing section 111 including a CPU. The computing processing section 111 is connected to a display unit 119, a mount program storing section 112, a transfer data storing section 120, an equipment unique data storing section 121, a motor controller 113, an external input/output section 114, an image processing section 115, a server communication section 116, and a feeder communication control section 117.

The mount program storing section 112 stores mount programs for mounting the components E and various kinds of data. The various kinds of data includes the number of printed circuit boards P that are scheduled to be produced, board information on types of boards, and information on the number or a kind of components E stored in the component supply device 13.

The motor controller 113 controls the Y-axis linear motor 51, the X-axis servo motor 52, the Z-axis servo motor 53, the R-axis servo moto 54, and the transfer conveyers 15 according to the mount program stored in the mount program storing section 112 to mount the components E.

The external input/output section 114 is a so-called interface and receives detection signals output from the sensors such as the first sensor 165, the second sensor 166, and the third sensor 167 that detect the trailing end of the tape 22 of the component tape 21 to detect presence of the tape 22 in the feeder 16. The external input/output section 114 is connected to a stopper 122, a tape cutting section 60, and a tape discharge section 70 which will be described later and configured to receive and output control signals for controlling the operations of them.

The image processing section 115 is configured to receive image signals output from the board recognizing camera 46 and the component recognizing cameras 17 and create an image based on the received image signals.

The feeder communication controller 117 is electrically connected to the ALF controller 118 of each of the feeders 16 installed in the component supply device 13 to control each of the feeders 16. The ALF controller 118 is connected to the driving shaft motor 55 and the loading shaft motor 56 and controls the operations thereof.

Figure 4:
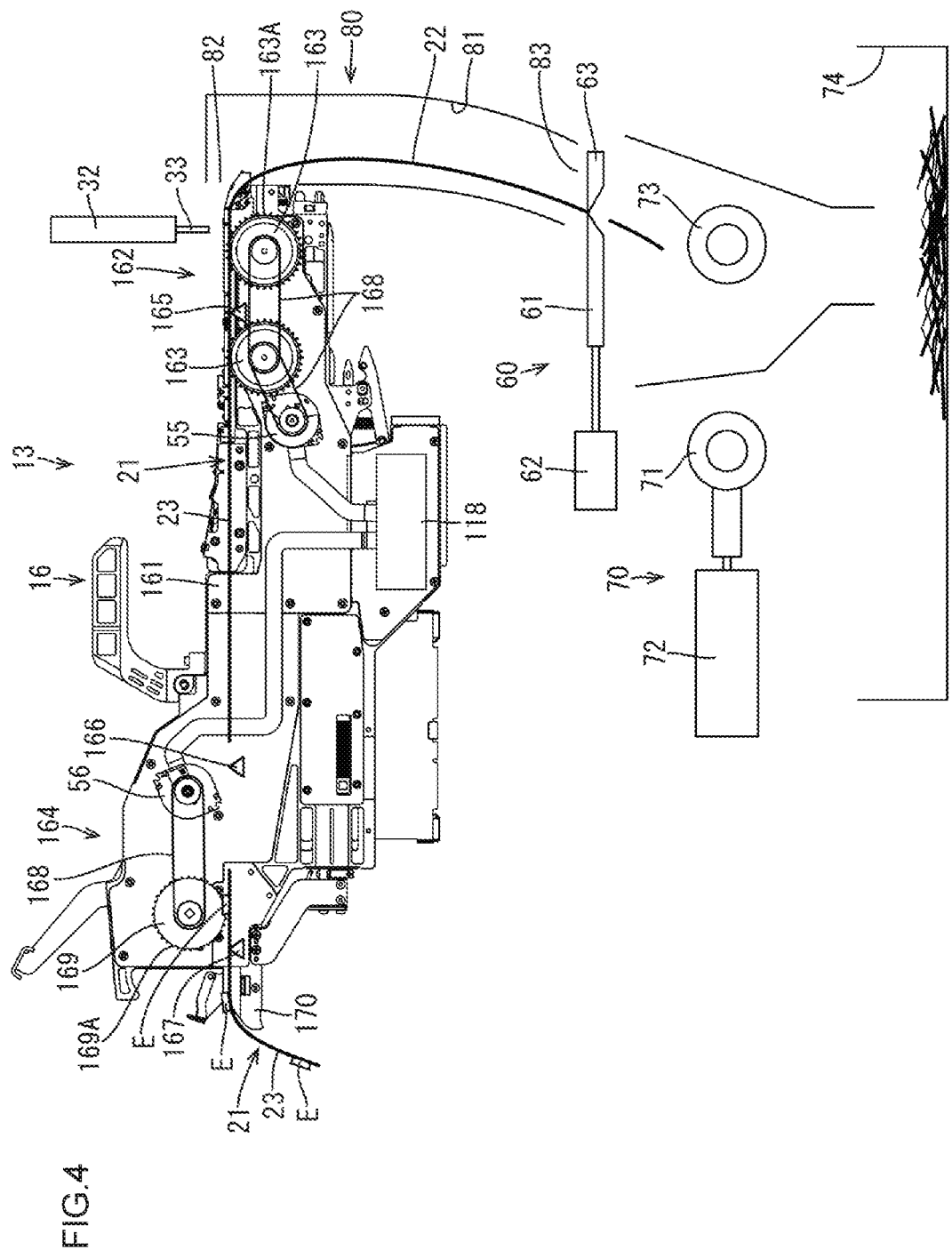
FIG. 4 is a side view of the component supply device right after cutting the empty tape with the tape cutting section.
Figure 5:
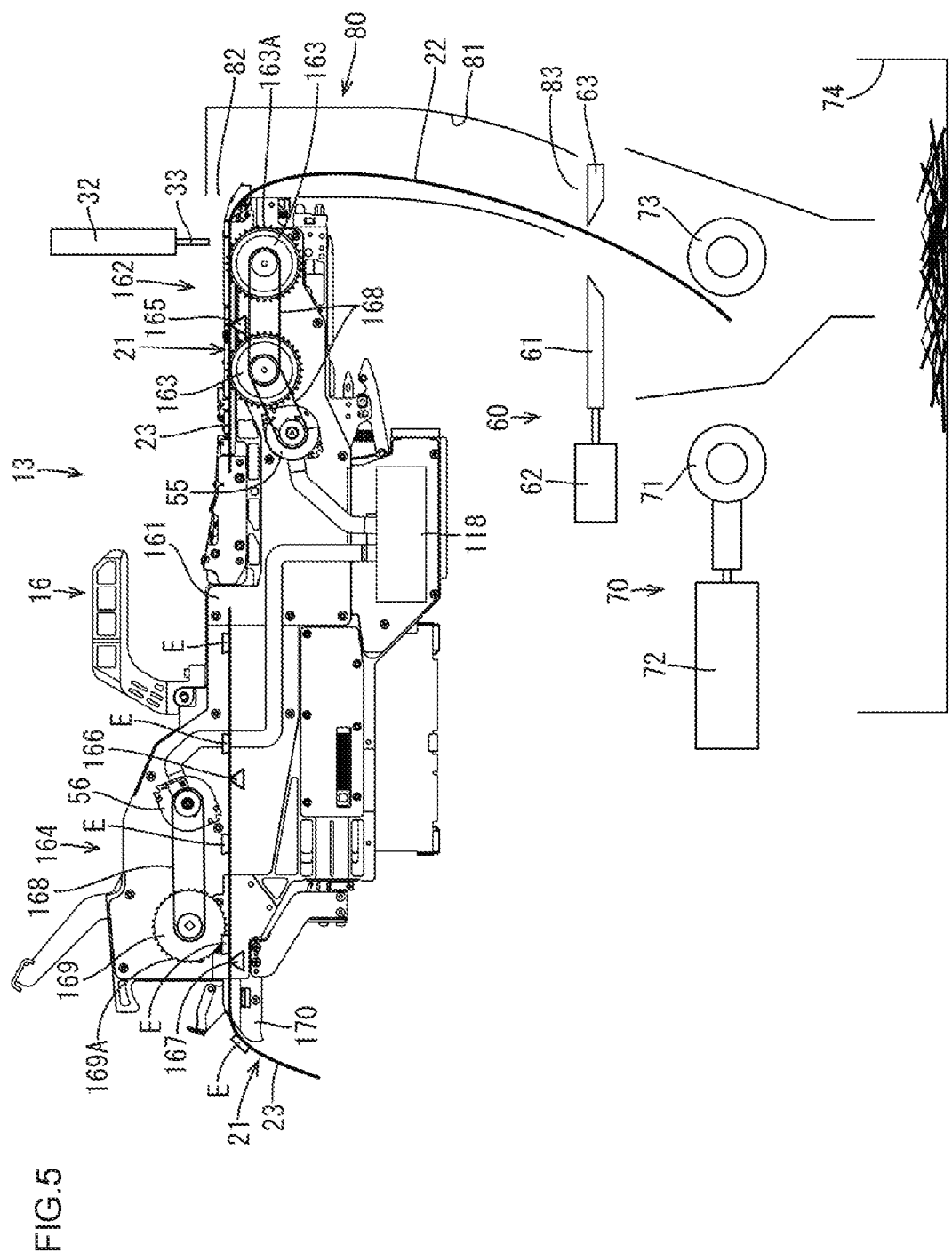
FIG. 5 is a side view of the component supply device that is discharging a tape with a driving shaft motor.

After the components E are suctioned by the suction nozzles 33 of the mount heads 32, the component tape 21 has no component E and becomes the empty tape 22. The empty tape 22 is discharged from the front end portion of the feeder 16 and introduced into a tape guide section 80. As illustrated in FIG. 4, the tape guide section 80 includes a sloped surface 81, an inlet 82, and an outlet 83. The sloped surface 81 is gently sloped toward the back side as it extends downward. The empty tape 22 enters the tape guide section 80 through the inlet 82 and exits outside through the outlet 83. The inlet 82 is included in an upper end portion of the tape guide section 80 and open toward the back side. The outlet 83 is included in a lower end portion of the tape guide section 80 and open downward.

The tape cutting section 60 is disposed below the tape guide section 80. The tape cutting section 60 includes a tape cutter 61, an air cylinder 62, and a fixed blade 63. The air cylinder 62 can move the tape cutter 61 in the front-back direction. The empty tape 22 is cut by the tape cutter 61 projecting frontward and the fixed blade 63. When the air cylinder 62 is supplied with air, the tape cutter 61 is moved frontward and the empty tape 22 is cut between the tape cutter 61 and the fixed blade 63.

The tape discharge section 70 is disposed below the tape cutting section 60. The tape discharge section 70 is for feeding the empty tape 22 downward. The tape discharge section 70 includes a discharge roller 71, an air cylinder 72, and a fixed roller 73. The air cylinder 72 moves the discharge roller 71 in the front-back direction. The discharge roller 71 projecting frontward and the fixed roller 73 hold the empty tape 22 therebetween. As illustrated in FIG. 2, the fixed roller 73 is connected to a motor 75 via a belt 76 and configured to be rotated by the motor 75. Therefore, if the air cylinder 72 is supplied with air, the discharge roller 71 is moved frontward and comes into contact with the fixed roller 73 and follows the rotation of the fixed roller 73. The fixed roller 73 is rotated while the empty tape 22 being held between the discharge roller 71 and the fixed roller 73, and the empty tape 22 is fed downward and stored in a tape storing box 74.

Figure 6:
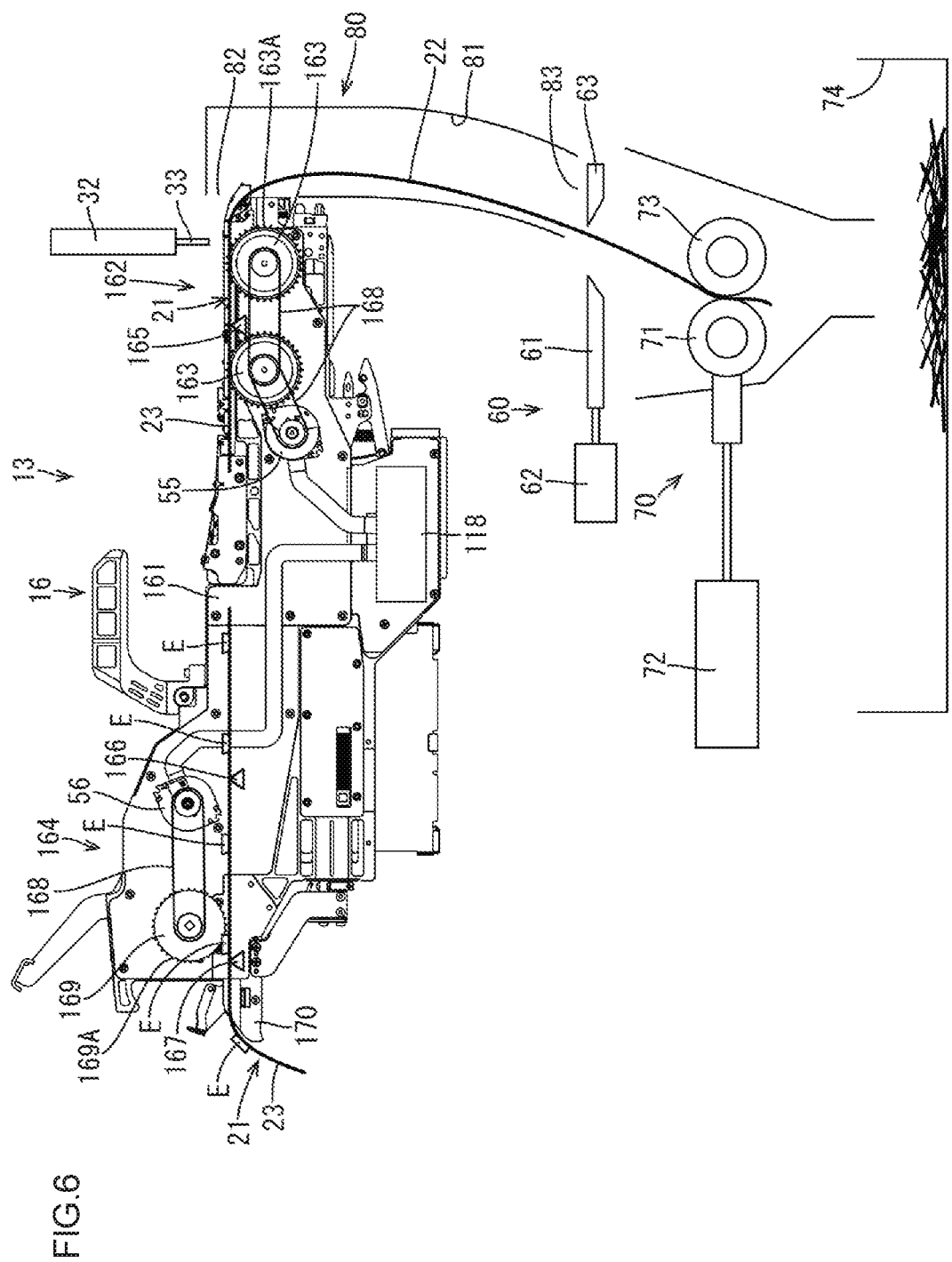
FIG. 6 is a side view of the component supply device that is discharging the empty tape with a tape discharge section.
Figure 7:
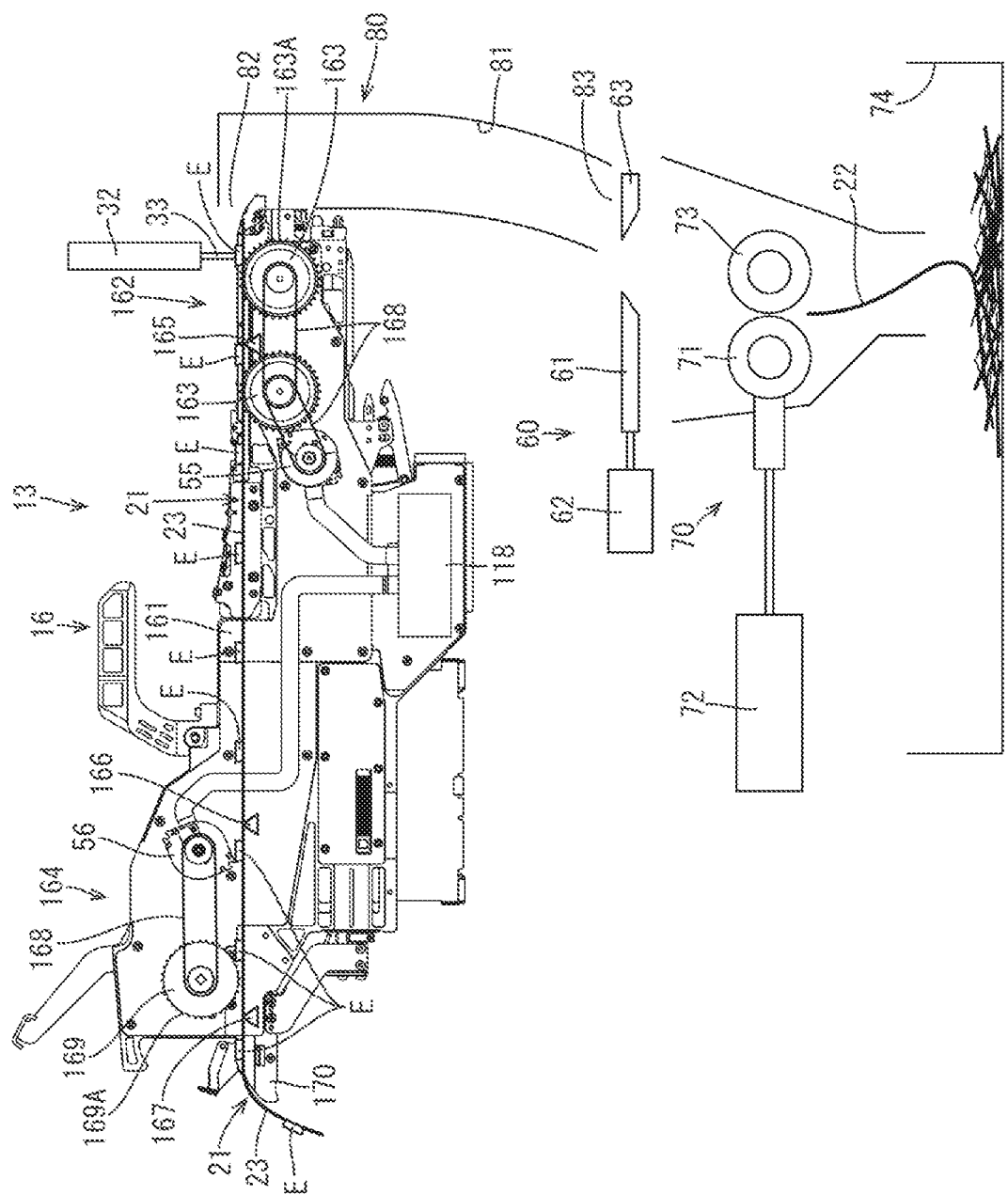
FIG. 7 is a side view of the component supply device that has discharged the empty tape with the tape discharge section.
Figure 13:
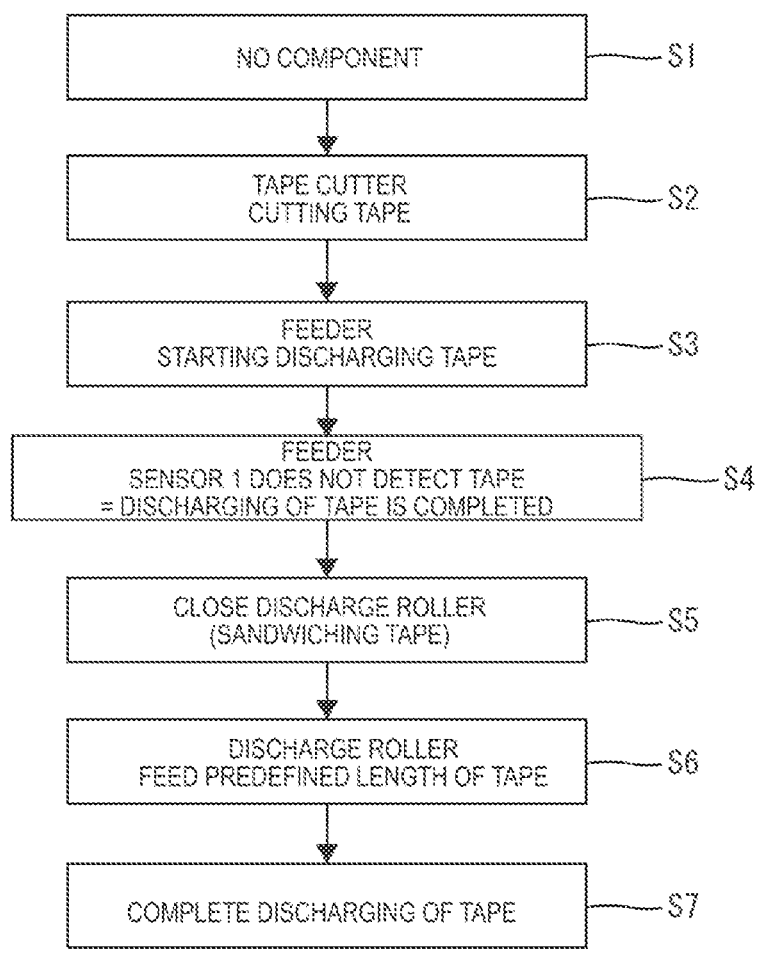
FIG. 13 is a flowchart illustrating a sequence of discharging a tape.

Next, a sequence of discharging the empty tape 22 will be described with reference to the flowchart in FIG. 13. If determining that the component tape 21 has no component E (step S1), the controller 110 controls the tape cutter 61 to cut the empty tape 22 (step S2). Next, the front-side sprocket 163 of the feeder 16 feeds the empty tape 22 forward and discharging of the empty tape 22 is started (step S3). After the trailing end of the empty tape 22 passes the first sensor 165, the first sensor 165 does not detect an empty tape 22 anymore and it is determined that the discharging of the empty tape 22 by the front-side sprocket 163 is completed (step S4). Then, the front-side sprocket 163 is stopped. At this time, a leading edge of the empty tape 22 passes the discharge roller 71. As illustrated in FIG. 6, if the discharge roller 71 is closed, the empty tape 22 is sandwiched between the discharge roller 71 and the fixed roller 73 (step S5). Then, the fixed roller 73 is rotated by a motor to feed the empty tape 22 downward. After the empty tape 22 is fed for a predefined length (step S6) by the fixed roller 73, the trailing end of the empty tape 22 passes the discharge roller 71. Thereafter, as illustrated in FIG. 7, the empty tape 22 drops and is stored in the tape storing box 74 and the discharging of the empty tape 22 is completed (step S7).

Figure 8:
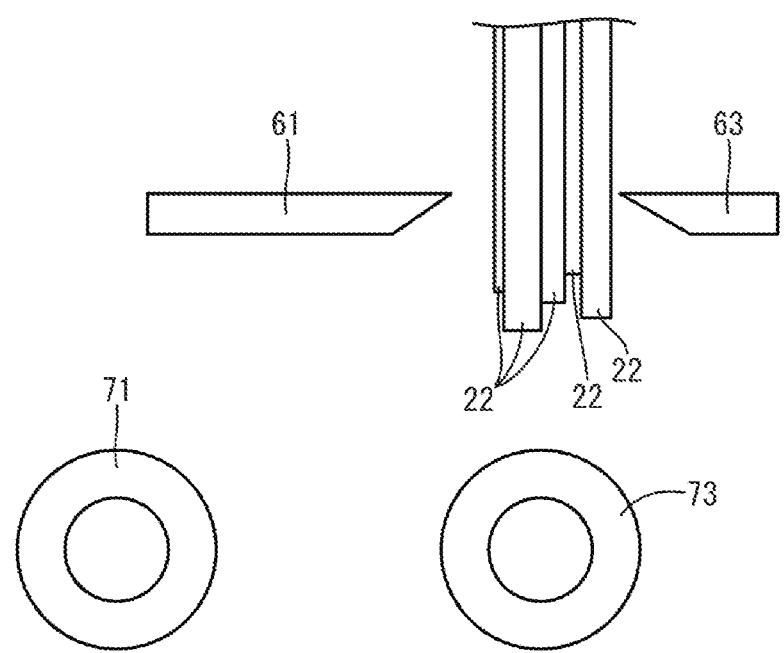
FIG. 8 is a side view of the tape cutting section before cutting empty tapes having different thicknesses.
Figure 9:
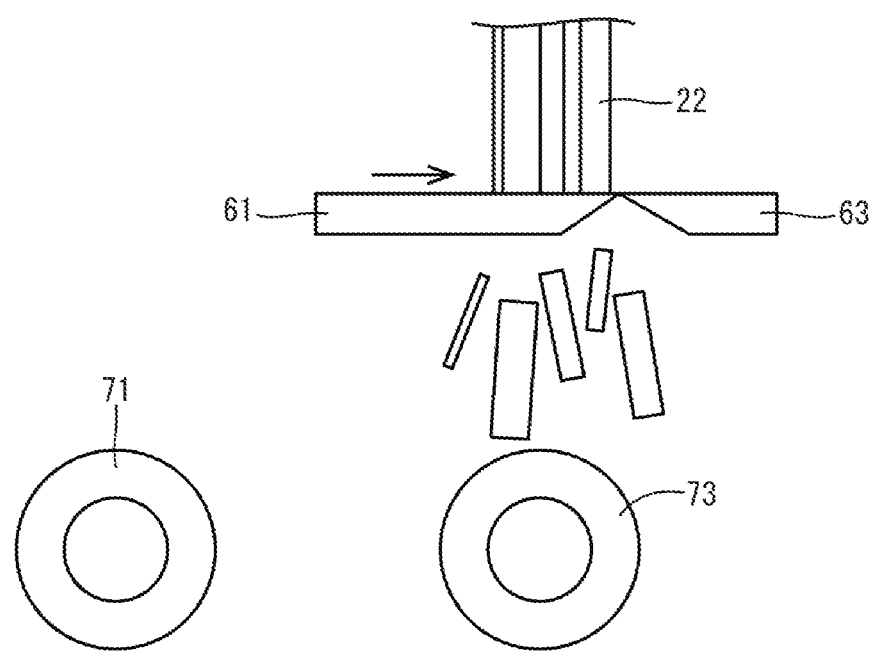
FIG. 9 is a side view of the tape cutting section after cutting the empty tapes having different thicknesses.
Figure 10:
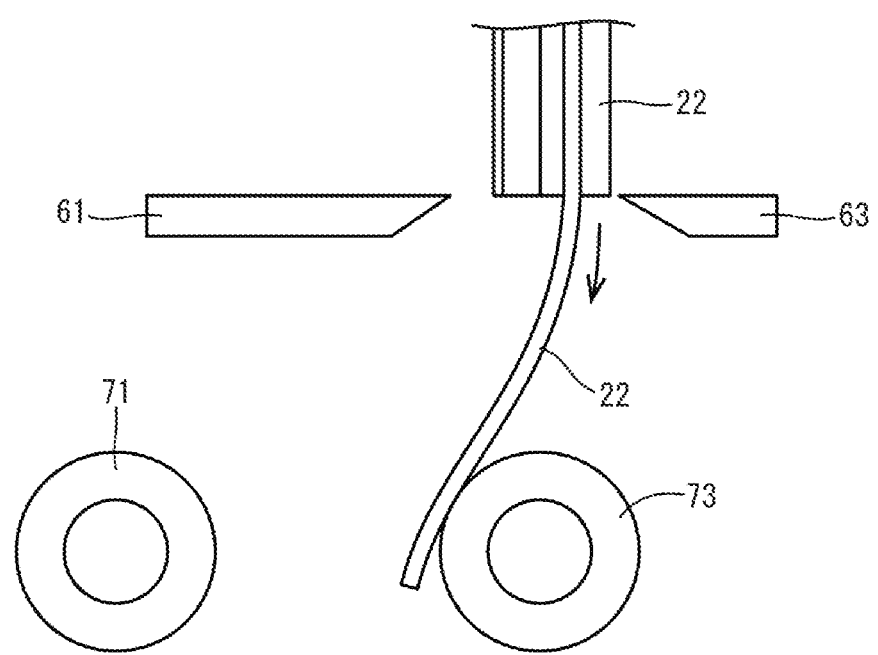
FIG. 10 is a side view of a thin empty tape that is discharged with a driving shaft motor.
Figure 11:
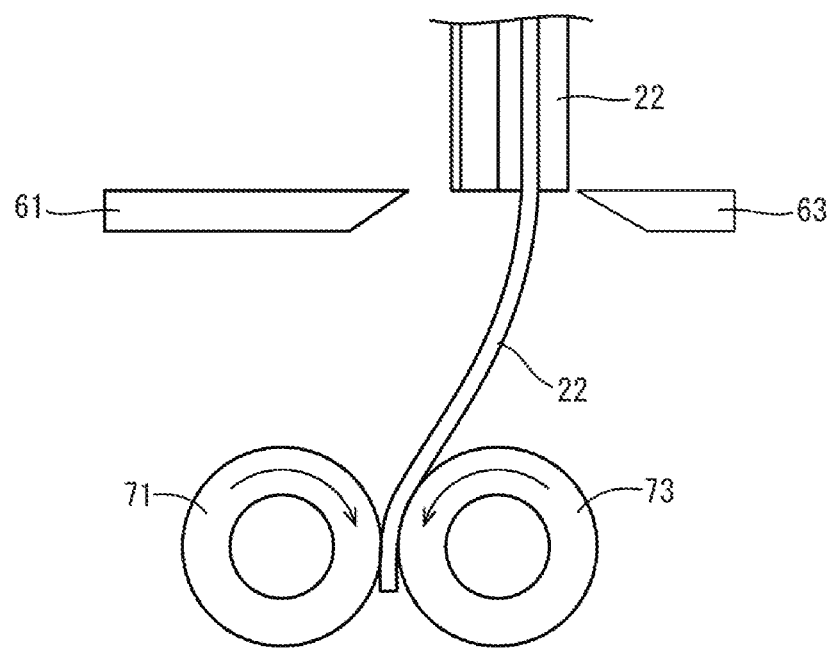
FIG. 11 is a side view of the tape discharge section that is discharging a thin empty tape.
Figure 12:
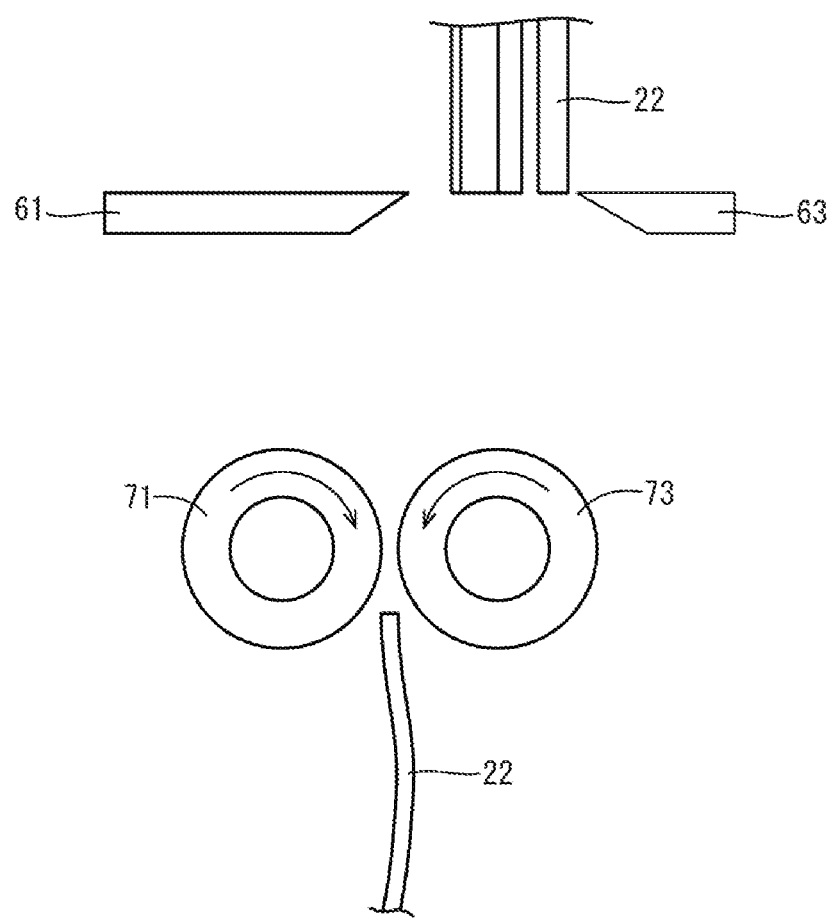
FIG. 12 is a side view of the tape discharge section that has discharged the thin empty tape.

The thickness and the shape of the empty tape 22 are determined by the thickness and the shape of the component E to be stored. Therefore, as illustrated in FIG. 8, if the empty tapes 22 have different thicknesses, it is assumed that the thick empty tape 22 may be fed but the thin empty tape 22 may not be fed. In this embodiment, as illustrated in FIG. 9, the empty tapes 22 having different thicknesses are collectively cut by the tape cutter 61 and only the empty tape 22 that is to be discharged is fed by the front-side sprocket 163 as illustrated in FIG. 10. After the leading edge of the empty tape 22 passes the discharge roller 71 and the trailing end of the empty tape 22 passes the first sensor 165, the feeding by the front-side sprocket 163 is stopped and the discharge of the empty tape 22 by the discharge roller 71 is started as illustrated in FIG. 11. After the trailing end of the empty tape 22 passes the discharge roller 71, the empty tape 22 drops by its own weight, as illustrated in FIG. 12, and is stored in the tape storing box 74. Accordingly, only a desired empty tape 22 can be discharged.

As described above, according to the present embodiment, the empty tape 22 is fed to the tape guide section 80 by the tape driving section (the driving shaft motor 55, the front-side sprocket 163) and the empty tape 22 is guided downward by the tape guide section 80. If it is determined that the component tape 21 has no component E, the empty tape 22 that projects downward from the tape guide section 80 is cut by the tape cutting section 60 and a cut piece of the tape 22 is discharged by the tape discharge section 70. Thus, the empty tape 22 that remains in the tape guide section 80 is less likely to be jammed or tangled.

The device may be configured to include the first sensor 165 that detects presence of the tape 23 included in the component tape 21 and the controller 110 configured to control the tape discharge section 70 to discharge the tape 23 downward if the tape 23 is not detected by the first sensor 165. According to such a configuration, since the first sensor 165 can detect that there is no tape 23, the empty tape 22 can be discharged based on the detection result.

The second sensor 166 may be disposed on the back side with respect to the first sensor 165 to detect the trailing end or the tape 23. If one of the tapes 23 is not detected by the second sensor 166, the controller 110 may control the tape cutting section 60 to cut collectively the empty tapes 22 and control the tape driving section to feed forward only the empty tape 22 to be discharged. Then, the controller 110 may control the tape discharge section 70 to discharge the empty tape 22.

According to such a configuration, if the multiple empty tapes 22 are present, it is difficult to discharge only a specific empty tape 22. However, only the empty tape 22 that is to be discharged is fed forward by the tape driving section such that only the empty tape 22 to be discharged can be discharged by the tape discharge section 70.

The controller 110 may be configured to control the tape driving section to feed the tape 23 forward. If the first sensor 165 detects no tape 23, the controller 110 may be configured to stop the tape driving section and control the tape discharge section 70 to discharge the empty tape 22.

According to such a configuration, the empty tape 22 can be discharged based on the detection signal on the tape 23 output from the first sensor 165.

Other Embodiments

The technology described herein is not limited to the embodiment described in the above description and the drawings. The following embodiments may be included in the technical scope of the technology described herein, for example.

(1) In the above embodiment, the first sensor 165 detects presence of the tape 23. However, if the length of the component tape 21 is previously known, the presence of the tape 23 may be determined according to the length of the component tape 21 that has been fed.

(2) In the above embodiment, when the trailing end of the tape 23 is not detected by the second sensor 166, the multiple empty tapes 22 are collectively cut. However, the multiple empty tapes 22 may be collectively cut when the trailing end of the tape 23 is not detected by the first sensor 165.

(3) In the above embodiment, the discharging of the empty tape 22 with the discharge roller 71 is started after the front-side sprocket 163 stops. However, the discharging of the empty tape 22 with the discharge roller 71 may be started before the front-side sprocket 163 stops.

(4) In the above embodiment, the tape cutting section 60 and the tape discharge section 70 are included in the component supply device 13. However, the tape cutting section and the tape discharge section may be disposed on the cart 14. One of the tape cutting section and the tape discharge section may be included in the component supply device 13 and another one may be disposed on the cart 14.

What is claimed is:

1. A component mounting device comprising:
feeders each of which is configured to feed a component tape including components thereon in a feeding direction, the feeders being arranged in a direction perpendicular to the feeding direction, each of the feeders including a main body including
a first section including a tape inlet configured to receive the component tape including the components,
a second section in which a component pick-up position is defined and including a tape outlet configured to discharge an empty tape including no component, the empty tape being obtained after the components of the component tape are picked up at the component pick-up position, and
a transfer mechanism disposed in the second section and configured to feed the component tape including the components in the feeding direction to the component pick-up position and feeding the empty tape to the tape outlet;
a tape guide including
a tape guide inlet that is disposed opposite tape outlets of the feeders and is configured such that through which empty tapes discharged through the tape outlets, respectively, are inserted to the tape guide, and
a tape guide outlet configured to discharge the empty tapes inserted through the tape guide inlet and guided along the tape guide;
a tape cutter disposed below the tape guide outlet of the tape guide and configured to cut the empty tapes that are discharged outside the tape guide outlet; and
a pair of tape discharge rollers disposed below the tape cutter and configured to hold one of the empty tapes between the pair of tape discharge rollers and discharge the one of the empty tapes downward, the one of the empty tapes being discharged from one of the feeders through a corresponding one of the tape outlets and fed to the pair of tape discharge rollers by the transfer mechanism after being cut by the tape cutter and having a trailing end in the second section.

2. The component mounting device according to claim 1, further comprising a controller, wherein
each of the feeders includes a first sensor disposed in the second section of each of the feeders and configured to detect presence of the component tape, and
the controller is configured to control the pair of tape discharge rollers to discharge the one of the empty tapes downward in response to determination that no presence of the component tape is detected by the first sensor.

3. The component mounting device according to claim 2, wherein
each of the feeders includes a second sensor disposed in the first section of each of the feeders and configured to detect presence of the component tape, and
the controller is configured to
control the tape cutter to cut the empty tapes collectively in response to determination that no presence of the component tape is detected by the second sensor,
control the transfer mechanism to feed only the one of the empty tapes in the feeding direction, and
control the pair of tape discharge rollers to discharge the one of the empty tapes.

4. The component mounting device according to claim 3, wherein
the controller is configured to stop the transfer mechanism in response to determination that no presence of the component tape is detected by the first sensor.

5. A component mounting device comprising:
a feeder configured to feed a component tape in a feeding direction, the feeder including a main body including
a first section including a tape inlet configured to receive the component tape,
a second section in which a component pick-up position is defined and including a tape outlet configured to discharge the component tape after components of the component tape are picked up at the component pick-up position, and a transfer mechanism disposed in the second section and configured to feed the component tape in the feeding direction to the tape outlet via the component pick-up position, a first sensor disposed in the second section and configured to detect presence of the component tape;

a second sensor disposed in the first section and configured to detect presence of the component tape;

a tape guide including
- a tape guide inlet that is disposed opposite the tape outlet of the feeder and is configured such that through which the component tape discharged through the tape outlet is inserted to the tape guide, and
- a tape guide outlet configured to discharge the component tape inserted through the tape guide inlet and guided along the tape guide;

a tape cutter disposed below the tape guide outlet of the tape guide and configured to cut the component tape that is discharged through the tape guide outlet;

a pair of tape discharge rollers disposed below the tape cutter; and a controller configured to
- control the tape cutter to cut the component tape in response to determination that no presence of the component tape is detected by the second sensor,
- control the transfer mechanism to feed the component tape that remains in the tape guide and has a trailing end in the first section after cutting by the tape cutter to the pair of tape discharge rollers, and
- control the pair of tape discharge rollers to hold the component tape that is fed to the pair of tape discharge rollers between the pair of tape discharge rollers in response to determination that no presence of the component tape is detected by the first sensor.

6. The component mounting device according to claim 5, wherein
the controller is configured to stop the transfer mechanism in response to determination that no presence of the component tape is detected by the first sensor.

\* \* \* \* \*